United States Patent [19]

Wallace et al.

[11] Patent Number: 5,606,177
[45] Date of Patent: Feb. 25, 1997

[54] SILICON OXIDE RESONANT TUNNELING DIODE STRUCTURE

[75] Inventors: Robert M. Wallace, Dallas; Alan C. Seabaugh, Richardson, both of Tex.

[73] Assignee: Texas Instruments Incorporated, Dallas, Tex.

[21] Appl. No.: 349,866

[22] Filed: Dec. 6, 1994

Related U.S. Application Data

[63] Continuation-in-part of Ser. No. 145,267, Oct. 29, 1993.
[51] Int. Cl.[6] .................................................. H01L 29/88
[52] U.S. Cl. .............................. 257/25; 257/17; 257/22; 257/28
[58] Field of Search .................................. 257/17, 22, 25, 257/28

[56] References Cited

U.S. PATENT DOCUMENTS

| | | | |
|---|---|---|---|
| 4,471,471 | 9/1984 | DiMaria | 257/321 |
| 5,216,262 | 6/1993 | Tsu | 257/17 |
| 5,229,623 | 7/1993 | Tauoue | 257/25 |
| 5,352,330 | 8/1994 | Wallace | 156/643 |

*Primary Examiner*—Jerome Jackson, Jr.
*Attorney, Agent, or Firm*—Carlton H. Hoel; W. James Brady, III; Richard L. Donaldson

[57] ABSTRACT

A resonant tunneling diode (400) made of a silicon quantum well (406) with silicon oxide tunneling barriers (404, 408). The tunneling barriers have openings (430) of size smaller than the electron wave packet spread to insure crystal alignment through the diode without affecting the tunneling barrier height, and the openings (430) have an irregular (nonperiodic) shape.

9 Claims, 6 Drawing Sheets

SILICON OXIDE RESONANT TUNNELING DIODE STRUCTURE

CROSS-REFERENCE TO RELATED APPLICATIONS

This application is a continuation-in-part of copending application Ser. No. 08/145,267, filed Oct. 29, 1993. Copending application Ser. No. 08/250,976, filed May 31, 1994, discloses related subject matter. These applications all have a common assignee and are incorporated by reference.

BACKGROUND OF THE INVENTION

The invention relates to electronic devices, and, more particularly, to resonant tunneling devices and systems.

The continual demand for enhanced transistor and integrated circuit performance has resulted in improvements in existing devices, such as silicon bipolar and CMOS transistors and gallium arsenide MESFETs, and also in the introduction of new device types and materials. In particular, scaling down device sizes to enhance high frequency performance leads to observable quantum mechanical effects such as carrier tunneling through potential barriers. This led to development of alternative device structures such as resonant tunneling diodes and resonant tunneling hot electron transistors which take advantage of such tunneling phenomena.

Resonant tunneling diodes are two terminal devices with conduction carriers tunneling through potential barriers to yield current-voltage curves with portions exhibiting negative differential resistance. Recall that the original Esaki diode had interband tunneling (e.g., from conduction band to valence band) in a heavily doped PN junction diode. An alternative resonant tunneling diode structure relies on resonant tunneling through a quantum well in a single band; see FIG. 1 which illustrates a AlGaAs/GaAs quantum well. Further, Mars et al., Reproducible Growth and Application of AlAs/GaAs Double Barrier Resonant Tunneling Diodes, 11 J. Vac. Sci. Tech. B 965 (1993), and Özbay et al, 110-GHz Monolithic Resonant-Tunneling-Diode Trigger Circuit, 12 IEEE Elec. Dev. Lett. 480 (1991), each use two AlAs tunneling barriers imbedded in a GaAs structure to form a quantum well resonant tunneling diode. The quantum well may be 4.5 nm thick with 1.7 nm thick tunneling barriers. FIG. 2 illustrates current-voltage behavior at room temperature. Note that such resonant tunneling "diodes" are symmetrical. With the bias shown in FIG. 3a, a discrete electron level (bottom edge of a subband) in the quantum well aligns with the cathode conduction band edge, so electron tunneling readily occurs and the current is large. Contrarily, with the bias shown in FIG. 3b the cathode conduction band aligns between quantum well levels and suppresses tunneling, and the current is small.

Attempts to fabricate quantum wells in silicon-based semiconductors, rather than the III-V semiconductors such as AlGaAs and GaAs, have focussed primarily on silicon-germanium alloys. For example, the Topical Conference on Silicon-Based Heterostructures II (Chicago 1992) included papers such as Grützmacher et al., Very Narrow SiGe/Si Quantum Wells Deposited by Low-Temperature Atmospheric Pressure Chemical Vapor Deposition, 11 J. Vac. Sci. Tech. B 1083 (1993)(1 nm wide wells of $Si_{0.75}Ge_{0.25}$ with 10 nm wide Si tunneling barriers) and Sedgwick et al., Selective SiGe and Heavily As Doped Si Deposited at Low Temperature by Atmospheric Pressure Chemical Vapor Deposition, 11 J. Vac. Sci. Tech. B 1124 (1993)(Si/SiGe resonant tunneling diode selectively grown in an oxide window with silicon tunneling barriers each 5 nm wide and a 6 nm wide quantum well of $Si_{0.75}Ge_{0.25}$. Because the valence band offset greatly exceeds the conduction band offset at SiGe/Si interfaces, most investigators consider hole tunneling rather than electron tunneling using strained layer SiGe.

However, SiGe strained layers possess a serious intrinsic impediment in that the band discontinuities are small (less than 500 meV). This precludes room temperature operation with large peak-to-valley current differences (greater than approximately 5). Further, the addition of a strained heterojunction and new material, germanium, necessitates the undesirable development and implementation of new low temperature fabrication methods to allow production.

Tsu, U.S. Pat. No. 5,216,262, describes a silicon-based quantum well structure with tunneling barriers made of short period silicon/silicon dioxide superlattices of epitaxial silicon dioxide two monolayers thick.

Numerous investigators have studied the silicon/silicon oxide interface because it underlies performance of the currently prevalent CMOS transistor structure of silicon integrated circuits. The growth and analysis of single molecular layers of oxide have become commonplace. For example, Ohmi et al., Very Thin Oxide Film on a Silicon Surface by Ultraclean Oxidation, 60 Appl. Phys. Lett. 2126 (1992); Hattori, High Resolution X-ray Photoemission Spectroscopy Studies of Thin $SiO_2$ and $Si/SiO_2$ Interfaces, 11 J. Vac. Sci. Tech. B 1528 (1993); and Seiple et al., Elevated Temperature Oxidation and Etching of the Si(111) 7×7 Surface Observed with Scanning Tunneling Microscopy, 11 J. Vac. Sci. Tech. A 1649 (1993). The Ohmi et al. article observes that an oxide monolayer formed on a silicon wafer at 300° C. provides the foundation for oxide films superior to standard thermal oxide with respect to Frenkel-Poole emission for thin oxide films.

SUMMARY OF THE INVENTION

The present invention provides silicon-based resonant tunneling structures by use of perforated silicon dioxide tunneling barriers for epitaxial alignment of silicon layers with the perforations achieved by the clustering of oxygen on the silicon surface.

The invention has advantages including fabrication of resonant tunneling devices with standard integrated circuit materials and this allows for incorporation of resonant tunneling devices into integrated circuits.

BRIEF DESCRIPTION OF THE DRAWINGS

The drawings are schematic for clarity.

DESCRIPTION OF THE PREFERRED EMBODIMENTS

First preferred embodiment resonant tunneling diode

Figure 4A:
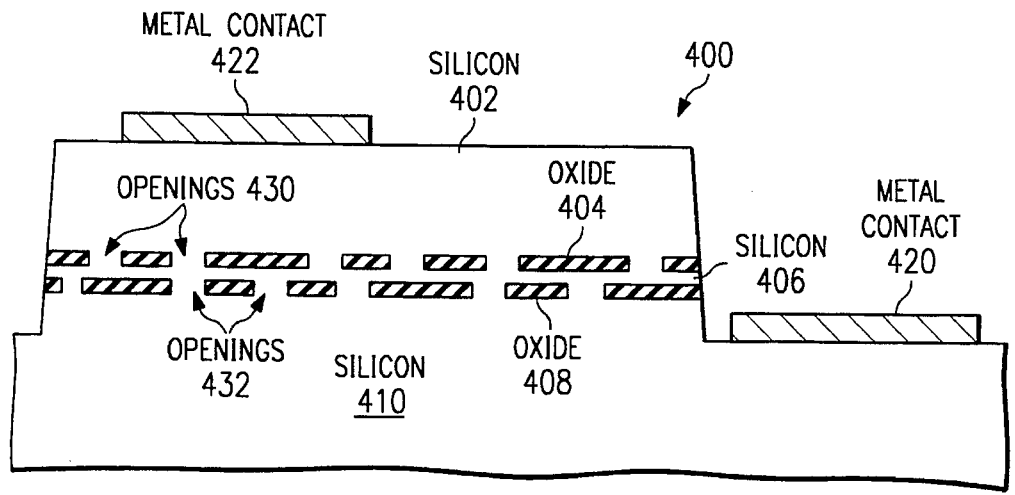
FIGS. 4a–b illustrate a first embodiment diode in cross sectional elevation and plan views.
Figure 4B:
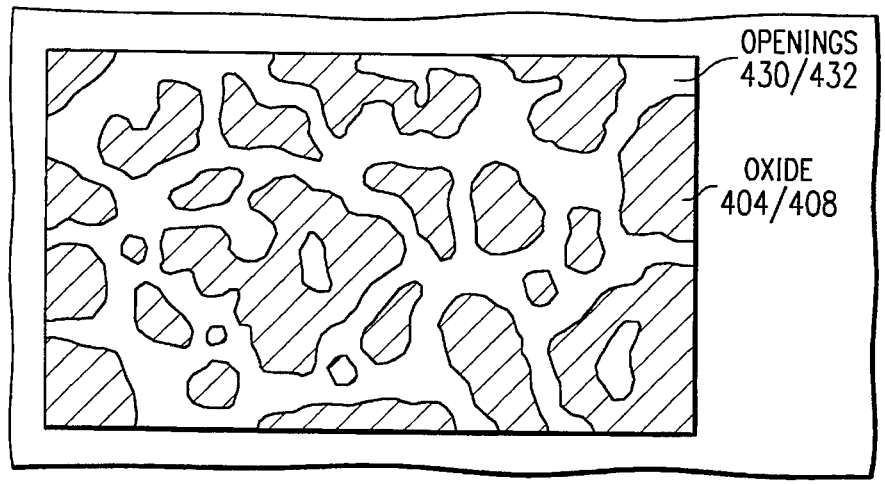

FIGS. 4a–b heuristically show first preferred embodiment resonant tunneling diode, generally denoted by reference numeral 400, in cross sectional elevation and plan views as including silicon anode 402, silicon dioxide ("oxide") tunneling barrier 404, silicon quantum well 406, oxide tunneling barrier 408, silicon cathode 410, anode metal contact 422, and cathode metal contact 420. Tunneling barriers 404 and 408 each has the structure of oxide regions interspersed with silicon regions; the silicon regions are denoted as openings 430 and 432 in the oxide layers 404 and 408, respectively. Openings 430 and 432 have somewhat irregular shape but generally do not contain any circular regions with diameter greater than approximately 3 nm. The plan view in FIG. 4b heuristically illustrates the structure of openings 430 and 432 in the tunneling barriers 404 and 408. Tunneling barriers 404/408 are each about 1 nm thick (roughly 4 molecular layers and amorphous) with transition layers and with about 1 μm by 2 μm oxide island sizes (thus FIGS. 4a–b are not to scale in that openings 430/432 should be much finer grained). Quantum well 406 is about 3 nm thick. Note that the thickness of barriers 404/408 primarily impacts the tunneling current magnitude and not the resonance levels which derives from the quantum well width and the barrier heights. Also, the exact electronic and chemical nature of the tunneling barriers varies through the barrier.

The spread of a wave packet describing an electron in a periodic potential (i.e., an electron in the single crystal silicon of anode 402, quantum well 406, or cathode 410) is roughly the reciprocal of the spread of wave vectors making up the wave packet. Thus with a spread of wave vectors small compared to dimensions of the Brillouin zone (which would be required for any resonance with respect to wave vector), the wave packet spread is over many crystal primitive cells. The wave packet spread in silicon is at least roughly 3 nm or about 6 primitive cells. Openings 430/432 in the tunneling barrier oxides have regions with inside diameter at most 3 nm and may be smaller. Hence, tunneling barriers 404/408 will appear to electrons (wave packets) as continuous and without penetrable openings. If an isolated region of openings 430/432 does have size upwards of 10 nm in diameter, then this region would appear as a high resistance in parallel to the tunneling barrier. Thus openings 430/432 need only generally have no large diameter regions, and the density of large diameter regions helps determine the leakage current.

Figure 5A:
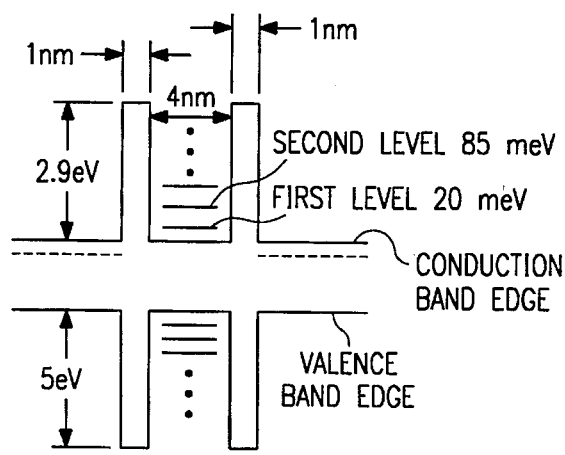
FIGS. 5a–c are band diagrams for the first preferred embodiment diode with various biases.
Figure 5B:
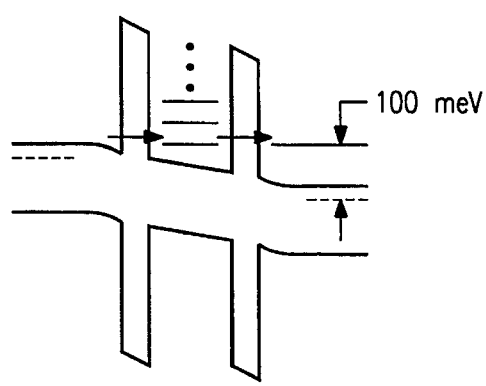
Figure 5C:
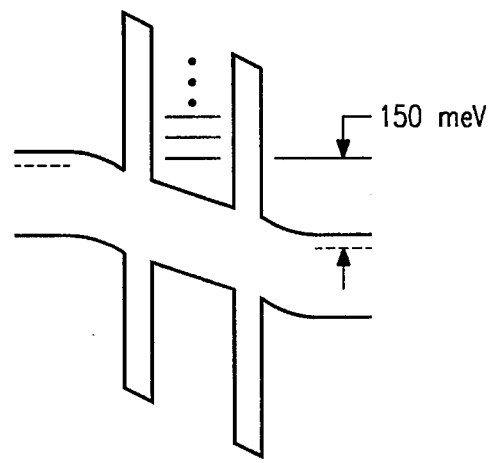

The width of quantum well 406 as 3 nm implies the edges of the lowest conduction subbands should lie at about 20 meV, 85 meV, 200 meV, and 350 meV above the conduction band edge due to the quantized component of crystal momentum in the quantum well. The conduction band offset at the silicon/oxide interface for very thin oxide is about 2.9 eV (compared with 3.2 eV for thick oxide), so FIG. 5a–c represents the band diagram for electron conduction through diode 400. In FIG. 5a a zero bias produces no current; in FIG. 5b a bias of approximately 100 mV across diode 400 yields the first resonant peak current as indicated by the arrows; and in FIG. 5c a bias of approximately 150 mV across diode 400 leads to the first valley current. Note that anode 402 may be doped n+ except for a few nm abutting barrier 404, and cathode 410 may be also be doped n+ except for a few nm abutting barrier 408. Spacing the doping from the tunneling barriers avoids incorporating dopant atoms into the tunneling barrier and opening regions where impurity-assisted tunneling can result. With a doped anode and cathode, the majority of the applied bias between anode and cathode appears across the barriers and quantum well. The dielectric constant of silicon is about three times that of oxide, so the applied voltage drop roughly splits into one third across the oxide barriers, one third across the quantum well, and one third across the undoped anode and cathode abutting the oxide barriers. The breakdown voltage for oxide is on the order of 10 MV/cm, so to avoid breakdown currents which may destroy the oxide barriers, voltage drops must be less than about 3 volts across the entire double barrier neglecting depletion on the cathode side of the tunneling barriers.

Diode 400 thus provides resonant tunneling in a system using only standard integrated circuit materials: silicon and oxide; and may operate at room temperature.

Controlled oxidation preferred embodiment

Figure 6A:
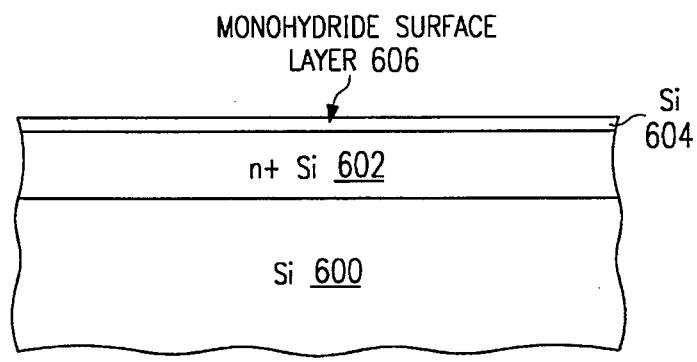
FIGS. 6a–c show fabrication steps of a preferred embodiment method.
Figure 6B:
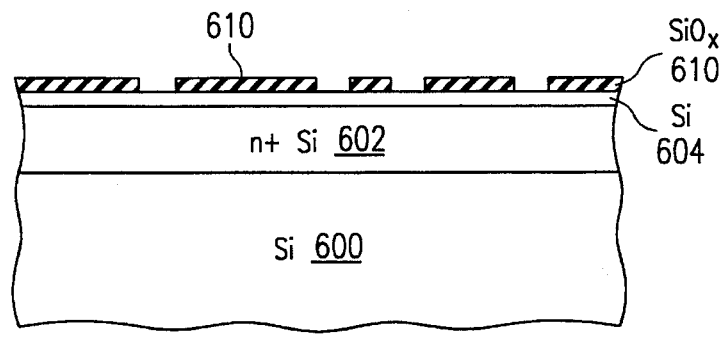
Figure 6C:
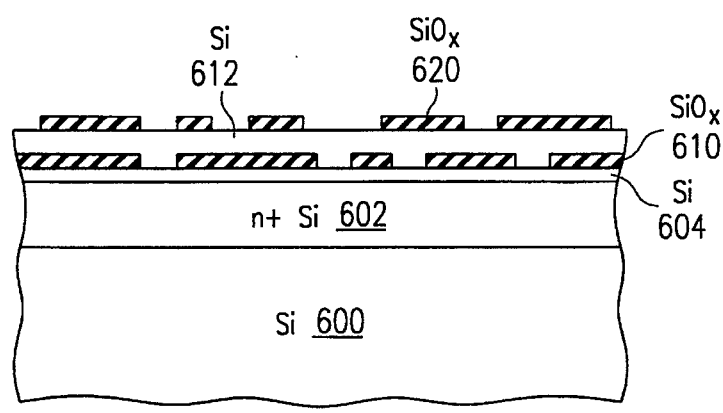

FIGS. 6a–c heuristically illustrate in cross sectional elevation views a preferred embodiment method of fabrication of diode 400 which uses controlled oxidation and includes the following steps:

(1) Begin with (111)- or (100)-oriented silicon wafer 600. Epitaxially grow 1 μm thick n+ layer of silicon 602 on wafer 600 in an LPCVD (low pressure chemical vapor deposition) reactor by decomposition of dichlorosilane with stibine ($SbH_3$) for in situ antimony doping. Then stop the stibine flow but continue epitaxial growth to form a 10 nm thick top layer of undoped silicon 604.

(2) Clean wafer 600 by a first rinse in an $HF/NH_4F$ solution to remove the roughly 1.4 nm of native oxide which grows when wafer 600 contacts air and then rinse with deionized wafer. The $HF/NH_4F$ rinse stabilizes the oxide-free silicon surface by forming a monohydride surface layer 606; see FIG. 6a.

(3) Insert wafer 600 into a molecular beam epitaxy (MBE) growth chamber and desorb the hydrogen in vacuum by heating the wafer to 350° C.; the hydrogen desorbs as $H_2$ and is pumped away and leaves behind a surface of activated silicon having dangling bonds or a metastable π-bonded surface. After the hydrogen desorption, lower the wafer temperature to 100° C. and introduce a beam of oxygen (either as molecular $O_2$ or as atomic O by cracking) into the chamber but with the quantity of oxygen only sufficient to partially oxidize the desorbed silicon surface. The oxygen reacts with (sticks to) the silicon surface and migrates and aggregates to initially form monolayer islands of silicon oxide, and as farther oxygen reacts the islands grow primarily laterally and begin merging. See FIG. 6b for a cross sectional view with $SiO_x$ islands 610; also FIG. 4b illustrates the plan view. The islands have irregular, nonperiodic shapes due to the chaotic nucleation and aggregation. Indeed, some islands may be an order of magnitude larger in area than others, and the islands are not necessarily convex and may include holes of exposed silicon (have a nontrivial homology group). Also, the wafer may be at room temperature or lower and the oxidation still proceeds.

(4) Increase the wafer temperature and then grow 5 nm of undoped epitaxial silicon 612 at about 500° C. The silicon source is just one of the Knudsen cells of the MBE growth chamber. This silicon grows epitaxially due to the exposed silicon between the islands of $SiO_x$ and extends laterally over the silicon oxide islands 610. This epitaxial layer will form the quantum well plus silicon to be oxidized for the next tunneling barrier. The wafer temperature is high enough to insure surface migration of the impinging silicon atoms and thus a layer with an essentially planar surface.

(5) Lower the wafer temperature to 100° C. and again introduce a beam of oxygen into the chamber but with the quantity of oxygen only sufficient to partially oxidize the just-grown silicon surface. Again, this forms irregular-shaped islands 620 of $SiO_x$; see FIG. 6c.

(6) Increase the wafer temperature and then grow 10 nm of undoped epitaxial silicon 622 at about 500° C. Again, this silicon grows epitaxially due to the exposed silicon between the islands of $SiO_x$ and extends laterally over the silicon oxide islands 620. Continue the epitaxial silicon growth for another 1 μm but with a source of antimony (e.g., Knudsen cell) to dope the silicon n+.

(7) Lastly, spin on photoresist and pattern it to define the diode mesa. Then etch down to the n+ layer below the oxide layers to form the diode mesa, and finally form metal anode/cathode contacts 420–422 by liftoff to complete diode 400.

Thermal desorption preferred embodiment

Figure 7A:
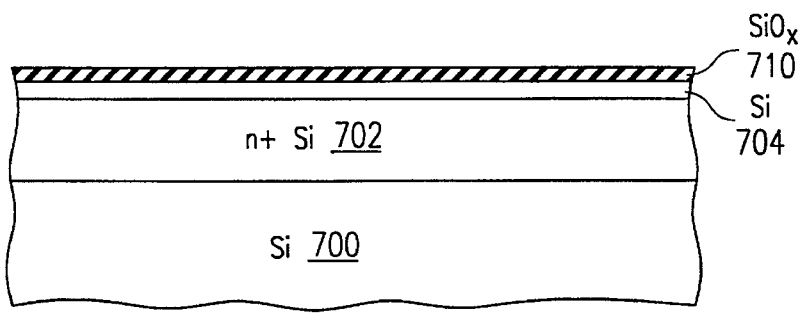
FIGS. 7a–b illustrate another preferred embodiment method.
Figure 7B:
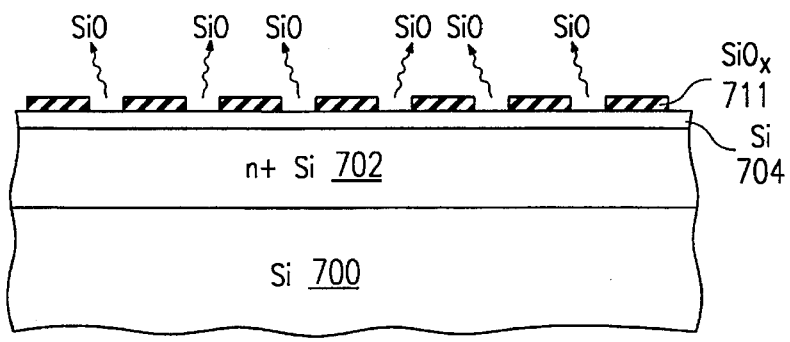

FIGS. 7a–b heuristically illustrate in cross sectional elevation views a preferred embodiment method of fabrication of diode 400 which uses thermal decomposition of a thin oxide layer to leave oxide islands with exposed silicon for epitaxial growth and includes the following steps:

(1) Follow step (1) of the controlled oxidation preferred embodiment to obtain silicon wafer 700 with a 1 μm thick n+ silicon layer 702 and a 10 nm thick undoped silicon top layer 704 as in steps (2)–(3) of the controlled oxidation preferred embodiment.

(2) Clean wafer 700 with a rinse in an $HF/N_4F$ solution then a rinse with deionized wafer to form a stabilized monohydride oxide-free silicon surface. Then in an MBE machine hard vacuum, heat wafer 700 to desorb the hydride, and introduce a limited amount of oxygen to grow the 3 nm thick oxide layer 710. This is more oxygen than in the controlled oxidation preferred embodiment, and the oxide islands merge to cover the entire wafer surface, but the oxide layer is thin; see FIG. 7a.

(3) After growth of oxide 710, again reduce the MBE chamber pressure to roughly $10^{-10}$ Torr and heat wafer 700 to roughly 730° C. to volatilize SiO from the surface and thereby thin oxide layer 710 to about 1 nm. The volatilization proceeds chaotically, and openings appear in oxide layer 710 and expand and merge, and layer 710 evolves into islands of oxide 711 which would evaporate under equilibrium conditions; however, this thermal decomposition of oxide layer 710 is stopped by lowering the temperature once the oxide layer has formed islands 711 or sufficient openings for epitaxial growth have appeared. See FIG. 7b. Ellipsometry, scanning tunneling microscopy, or other in situ monitoring can be used to determine an end point for the thermal decomposition.

(4) Oxide layer 711 now looks roughly like oxide layer 610, and the diode 400 can be completed by following steps (4)–(7) of the controlled oxidation preferred embodiment. Alternatively, the silicon quantum well can be grown and another roughly 3 nm thick oxide layer formed and thermally volatilized down to a 1 nm thick layer of oxide islands. Then steps (6)–(7) of the controlled oxidation preferred embodiment will complete the diode.

Electron stimulated desorption preferred embodiment

Figure 8:
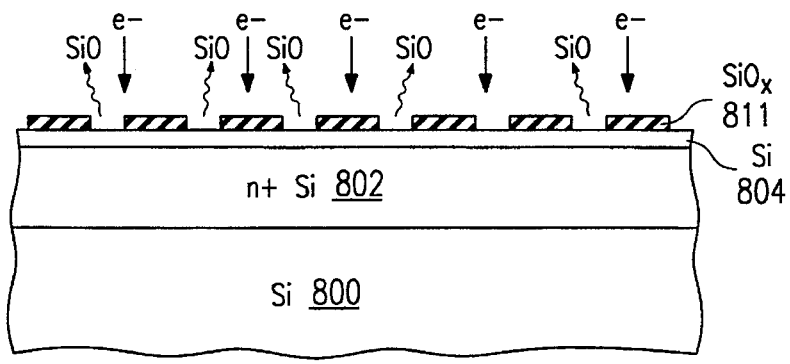
FIGS. 8–10 show further preferred embodiment methods.

FIG. 8 heuristically illustrates in cross-sectional elevation view a preferred embodiment method of fabrication of diode 400 which uses electron stimulated desorption of a thin oxide layer to leave oxide islands with exposed silicon for epitaxial growth and includes the following steps:

(1) Follow step (1) of the controlled oxidation preferred embodiment to obtain silicon wafer 800 with a 1 μm thick n+ silicon layer 802 and a 10 nm thick undoped silicon top layer 804.

(2) Oxidize wafer 800 to form a silicon oxide layer (not shown) about 3 nm thick. This oxidation may be roughly as in layer 710 of step (2) of the thermal decomposition preferred embodiment and the wafer is in an MBE machine.

(3) After growth of the oxide layer, reduce the MBE chamber pressure to roughly $10^{-10}$ Torr and raster scan an electron beam or a scanning tunneling microscope tip across the wafer with randomly varying beam intensity or applied voltage, respectively. This stimulates volatilization of the oxide as SiO from the surface and thereby thins the oxide layer. The volatilization proceeds chaotically, and when this oxide layer reaches an average thickness of roughly 1 nm it has developed openings which grow and merge to leave islands of oxide 811 which would eventually evaporate; however, this electron stimulated volatilization of the oxide layer is stopped by terminating the stimulation once the oxide layer has formed sufficient openings or islands 811. See FIG. 8 heuristically illustrating electron beam stimulated desorption. Ellipsometry, scanning tunneling microscopy, or other in situ monitoring can be used to determine an end point for the stimulated desorption.

(4) Oxide laye 811 now looks like oxide layers 610 and 711, and the diode 400 can be completed by following steps (4)–(7) of the controlled oxidation preferred embodiment. Alternatively, the silicon quantum well can be grown and another 3 nm thick oxide layer formed and thermally volatilized as in the thermal decomposition preferred embodiment or electron beam stimulated desorbed down to a 1 nm thick layer of oxide islands. Then steps (6)–(7) of the controlled oxidation preferred embodiment will complete the diode.

Stimulated desorption for oxide growth preferred embodiment

Figure 9:
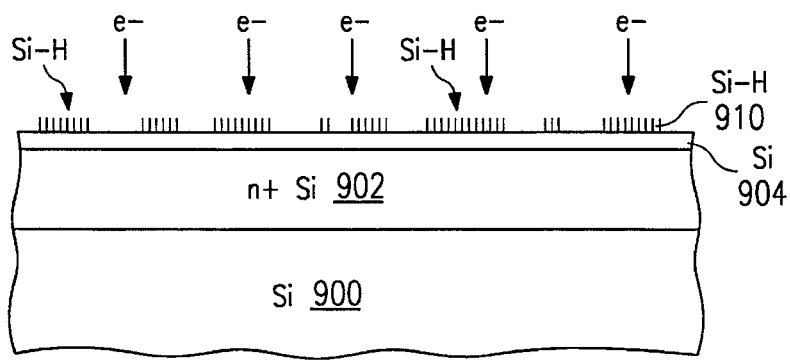

The electron beam stimulated desorption of SiO to thin and fragment an oxide layer can analogously be used for selective oxide island growth. In particular, follow steps (1)–(2) of the controlled oxidation preferred embodiment to form silicon wafer 900 with a thick n+ silicon epitaxial layer 902 and 10 nm undoped silicon epitaxial layer 904 having a monohydride surface. Then insert wafer 900 into an MBE chamber and raster scan a varying intensity electron beam over wafer 900 under vacuum. The electron beam stimulates hydrogen to desorb from areas with irregular shapes leaving islands of hydrided silicon 911 and exposed silicon in the complement; see heuristic FIG. 9. Then introduce a limited quantity of oxygen into the chamber. This oxygen reacts with the exposed silicon but not the hydrided silicon and thereby grows irregular shaped islands of oxide. A thermal desorption of the remaining hydrogen yields an irregular island oxide surface analogous to the preceding preferred embodiments, and the diode can be completed in an analogous manner.

An alternative approach uses an inert atmosphere such as argon for the electron beam scanning and thereby avoid high vacuum processing but still protects the exposed desorbed silicon areas from contamination. Note that oxygen "contamination" would not be a problem because the exposed silicon is to be oxidized anyway.

Further, the electron beam stimulated hydrogen desorption could be controlled to produce a regular pattern rather than chaotic regions, and the oxide would then grow in a regular pattern.

Surfactant catalysis oxidation preferred embodiment

Figure 10:
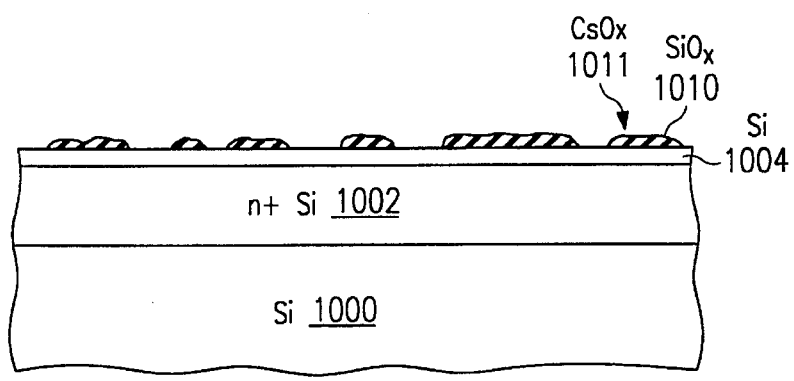

FIG. 10 illustrates an oxidation by catalytic species preferred embodiment method of forming tunneling barrier oxide with openings for silicon epitaxial growth. In particular, follow the initial steps of the controlled oxidation preferred embodiment to obtain wafer 1000 with thick n+ epitaxial layer 1002 and 10 nm thick undoped epitaxial layer 1004 which is stabilized by hydrides. Next, thermally desorb the hydride and introduce a limited quantity of cesium (e.g., from a alkali metal dispenser) at room temperature in ultra high vacuum. The cesium has a sublimation temperature of about 33° C. which will effectively limit the cesium coverage to one monolayer or less. Heating to 830° C. will desorb the cesium from a 7×7 reconstructed (111) silicon surface, so a short heating will chaotically desorb cesium, leaving islands analogous to the thermal desorption of oxide preferred embodiment. Then at room temperature introduce a limited quantity of molecular oxygen (or $N_2O$ or $H_2O$) into the chamber containing wafer 900. The molecular oxygen reacts with the cesium to yield atomic oxygen which reacts with the silicon to form silicon oxides which will be as islands 1010. The cesium 1011 migrates to the surface of the silicon oxide islands thus being formed. See FIG. 10. After the oxide formation, desorb the cesium with heat (830 ° C.) in a high vacuum. This yields the lower tunneling barrier, and complete the diode analogous to the preceding preferred embodiments or with another catalytic tunneling barrier oxide formation after epitaxial growth of the quantum well silicon.

Insulated gate oxide

The preferred embodiments may be used to generate thin gate oxides for silicon based insulated gate field effect transistors by simply making the quantum well silicon growth the first portion of gate layer formation. Similarly, the thin oxides could be used as capacitor dielectrics.

Multipeak resonances

The preferred embodiments may be extended to multiple quantum wells in series to form resonant tunneling diodes with multiple resonant peaks simply be growing further tunneling barriers and quantum wells on the preferred embodiment structures. Indeed, with successive abutting quantum wells and tunneling barriers grown, a superlattice structure may be obtained analgous to that of the Tsu patent cited in the background.

Continuous tunneling oxide

Figure 11A:
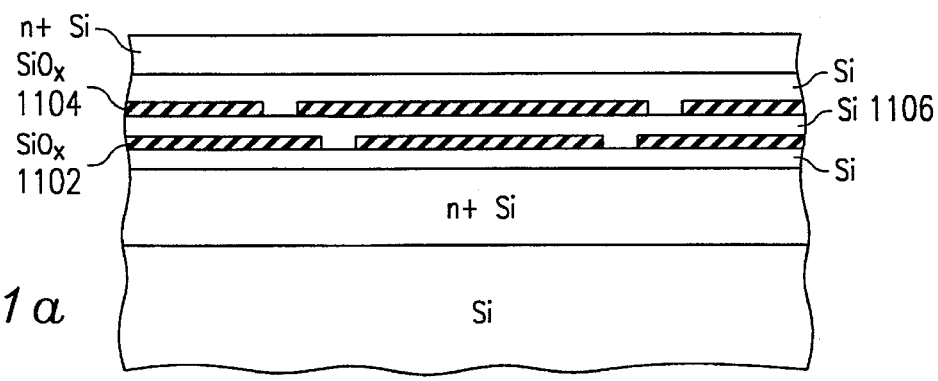
FIGS. 11a–b are cross sectional elevation views of an alternative preferred embodiment diode.
Figure 11B:
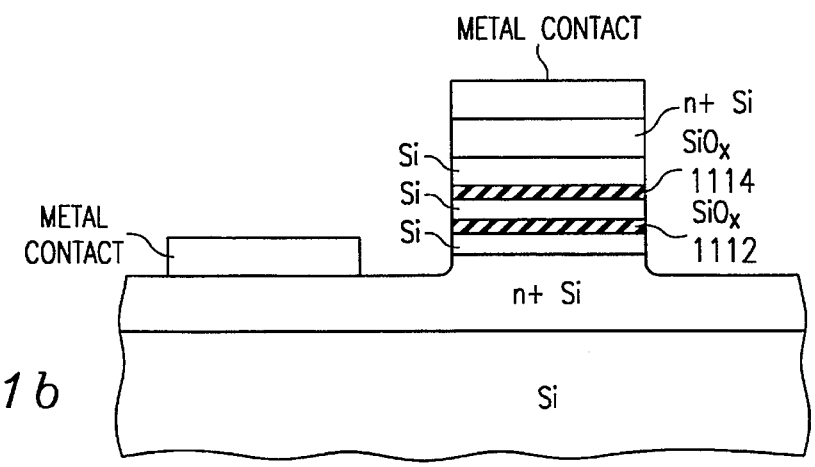

While the preceding preferred embodiment devices have tunneling barriers with perforations in the oxide, the devices can be fabricated within oxide regions containing continuous oxide islands. In particular, FIG. 11a shows perforated oxide films 1102-1104 with relatively large oxide islands about silicon quantum well 1106; the structure can be formed with any of the preferred embodiment methods. The mesa of the completed device can then contain continuous tunneling oxide barriers 1112-1114 as shown in FIG. 11b while retaining the features of epitaxial alignment of anode, cathode, and quantum well layers.

Applications

Figure 12A:
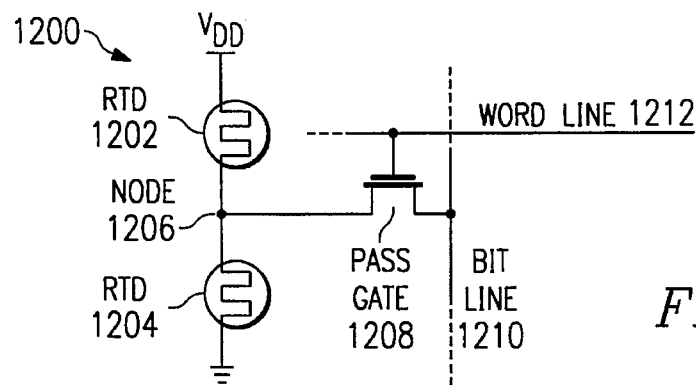
FIGS. 12a–c illustrate an SRAM application.
Figure 12B:
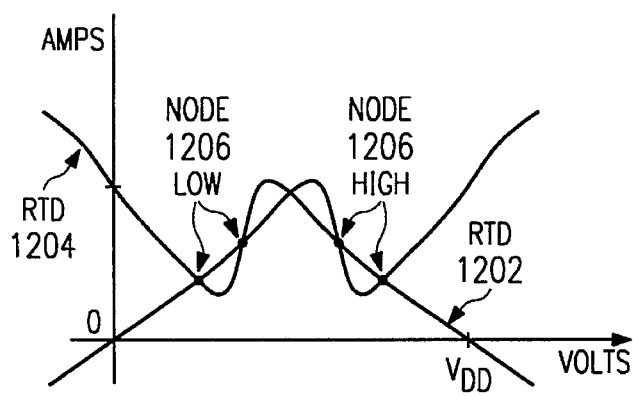
Figure 12C:
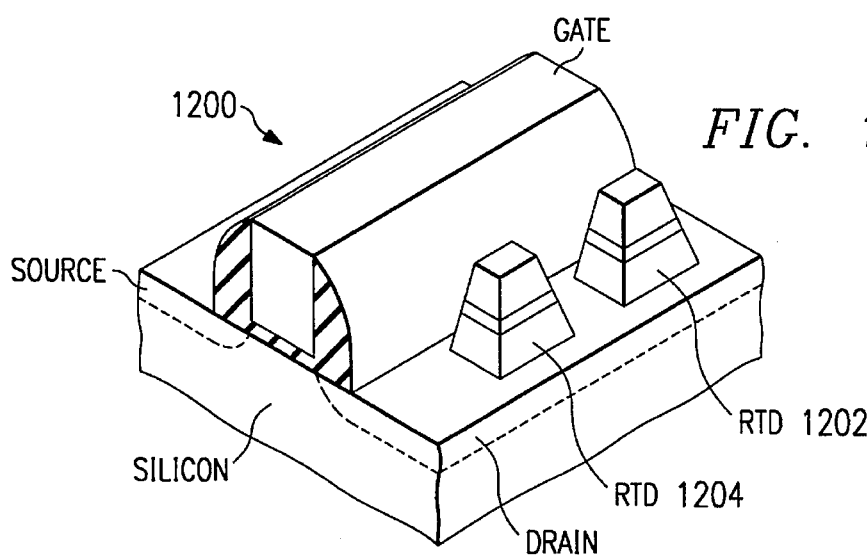

The preferred embodiments diodes may be incorporated into various structures such as the memory cell illustrated in FIGS. 12a-c. In particular, FIG. 12a schematically shows static random access memory (SRAM) cell 1200 as including resonant tunneling diodes 1202 and 1204 in series (RTD 1202 acts as the load for RTD 1204) and coupled to bitline 1210 by silicon field effect transistor pass gate 1208 controlled by the voltage on word line 1212.

Figure 1:
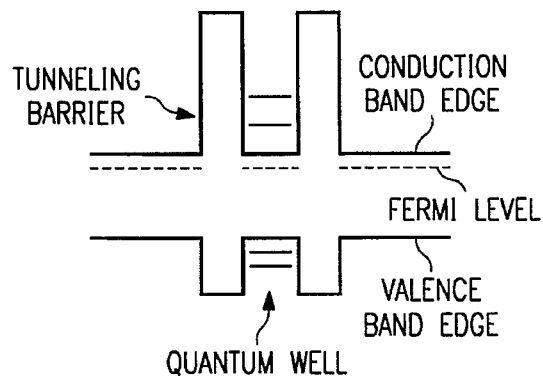
FIGS. 1–3b are band diagrams of a known resonant tunneling diode together with a current-voltage diagram.
Figure 2:
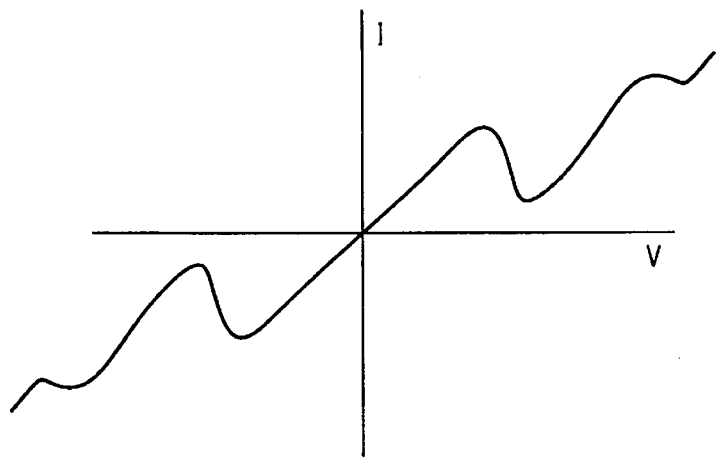
Figure 3A:
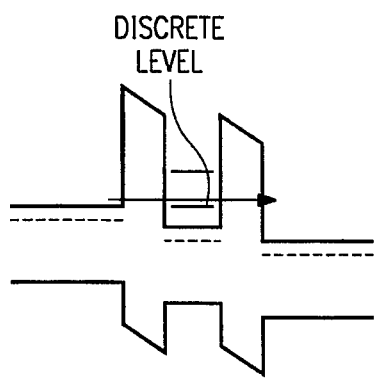
Figure 3B:
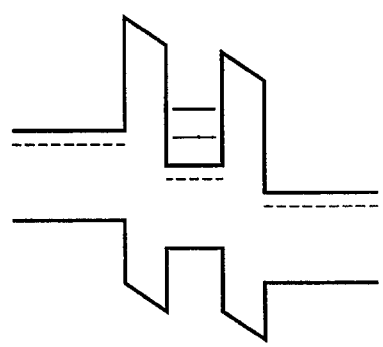

The bistability of node 1206 of cell 1200 derives from the bias voltage Vdd being set a little greater than the current valley of each RTD, so one RTD operates in its valley and the other RTD operates with small bias. FIG. 12b shows the superimposed current-voltage curves for RTDs 1202-1204 where each RTD has the characteristics illustrated in FIG. 2. The intersection points (a pair for the voltage on node 1206 close to Vdd (high) and a pair for node 1206 close to 0 (low)) indicate the stable series operation points. And accessing node 1206 through pass gate 1208 with a large driver to force node 1206 either high or low will force cell 1200 into a desired stable state; whereas, a sense amplifier accessing node 1206 through pass gate 1208 will detect the cell's state without disruption. Of course, a larger peak-to-valley ratio in the RTDs than that shown in FIG. 2 will make the high and low stable voltages for node 1206 closer to Vdd and 0, respectively.

FIG. 12c illustrates in perspective view the structure of FIG. 12a using a single silicon field effect transistor plus the preferred embodiment RTDs. Note that the parallel arrangement of the RTDs on the field effect transistor drain permits simultaneous fabrication with a mesa etch defining the locations of the RTDs. This structure can be easily fabricated by forming the RTDs first as in the preferred embodiments after the standard CMOS gate with self-aligned source/drain has been formed but prior to first insulation and metallization.

Other applications include logical data path functions such as adders and multipliers, analog-to-digital converter quantizers, or microwave oscillators.

Modifications

The preferred embodiments may be varied in many ways while retaining one or more of the features of epitaxial alignment of anode, cathode, and quantum well layers by irregular openings in barrier layers for epitaxial growth and such resonant tunneling heterostructures.

For example, the dimensions and shapes could be varied, such as in plan view a layout of elongated parallel fingers; mesa isolation could be replaced with a thick oxide growth isolation; and the oxide could be replaced with a grown nitride or oxynitride.

What is claimed is:

1. A resonant tunneling diode, comprising:

(a) a first terminal, a second terminal, and a quantum well, said quantum well made of a first material; and (b) first and second tunneling barriers, said first tunneling barrier separating said quantum well from said first terminal and said second tunneling barrier separating said quantum well from said second terminal, said first tunneling barrier characterized by first regions of said first material and which extend from said quantum well through said first tunneling barrier to said first terminal and second regions of a second material which forms a heterojunction with said first material, said first and second regions of complementary nonperiodic patterns.

2. The diode of claim 1, wherein:

(a) said first terminal, said second terminal, and said quantum well are made of silicon; and (b) said first tunneling barrier and said second tunneling barrier include a compound of silicon and oxygen.

3. The diode of claim 1, wherein:

(a) said first material is silicon; and (b) said second material is silicon dioxide.

4. The diode of claim 1, wherein:

(a) all areas within said first regions have diameters less than 3 nm.

5. An integrated circuit, comprising:

(a) a silicon-based transistor; and (b) a silicon resonant tunneling diode with tunneling barriers including an amorphous silicon-oxygen compound, said diode coupled to said transistor.

6. The integrated circuit of claim 5, wherein:
(a) said tunneling barriers each includes a region of silicon which abuts silicon regions on both sides of one of said tunneling barriers.

7. The integrated circuit of claim 6, wherein:
(a) said region of silicon have a nonperiodic pattern.

8. The integrated circuit of claim 5, wherein:
(a) said silicon-oxygen compound is silicon dioxide.

9. The integrated circuit of claim 5, wherein:
(a) said transistor is an insulated gate field effect transistor.

* * * * *